US009275838B2

(12) United States Patent
Juco et al.

(10) Patent No.: US 9,275,838 B2
(45) Date of Patent: Mar. 1, 2016

(54) ARRANGEMENTS FOR MANIPULATING PLASMA CONFINEMENT WITHIN A PLASMA PROCESSING SYSTEM AND METHODS THEREOF

(75) Inventors: Eller Y. Juco, San Jose, CA (US); Neungho Shin, San Ramon, CA (US); Yunsang Kim, Monte Sereno, CA (US); Andrew Bailey, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 927 days.

(21) Appl. No.: 12/552,474

(22) Filed: Sep. 2, 2009

(65) Prior Publication Data

US 2011/0049101 A1 Mar. 3, 2011

(51) Int. Cl.
*H01J 37/32* (2006.01)

(52) U.S. Cl.
CPC ..... *H01J 37/32183* (2013.01); *H01J 37/32541* (2013.01); *H01J 37/32568* (2013.01); *H01J 37/32706* (2013.01)

(58) Field of Classification Search
USPC ............ 156/345.43, 345.44, 345.45, 345.46, 156/345.47; 118/715, 722, 723 R, 723 E; 315/111.21
See application file for complete search history.

(56) References Cited

U.S. PATENT DOCUMENTS

| 4,392,932 | A | 7/1983 | Harra | |
|---|---|---|---|---|
| 6,677,711 | B2 * | 1/2004 | MacGearailt | 315/111.21 |
| 2001/0025606 | A1 | 10/2001 | Ichijo | 118/723 E |
| 2004/0035365 | A1 * | 2/2004 | Yamazawa et al. | 118/723 E |
| 2004/0118344 | A1 * | 6/2004 | Ni et al. | 118/723 E |
| 2004/0194890 | A1 * | 10/2004 | Moroz | 156/345.48 |
| 2005/0039682 | A1 | 2/2005 | Dhindsa et al. | |
| 2005/0263484 | A1 * | 12/2005 | Park et al. | 216/59 |
| 2008/0050923 | A1 | 2/2008 | Kim et al. | |
| 2008/0179297 | A1 | 7/2008 | Bailey et al. | |
| 2008/0185105 | A1 * | 8/2008 | Bailey et al. | 156/345.43 |
| 2008/0216864 | A1 | 9/2008 | Sexton et al. | |
| 2009/0230089 | A1 * | 9/2009 | Bera et al. | 216/67 |

FOREIGN PATENT DOCUMENTS

JP 06-275222 A 9/1994

OTHER PUBLICATIONS

"International Search Report", PCT Application No. PCT/US2010/046790, Mailing Date: Apr. 25, 2011.
"Written Opinion", PCT Application No. PCT/US2010/046790, Mailing Date: Apr. 25, 2011.
"International Preliminary Report on Patentability", PCT Application No. PCT/US2010/046790, Mailing Date: Mar. 15, 2012.

* cited by examiner

*Primary Examiner* — Maureen Passey
(74) *Attorney, Agent, or Firm* — Martine Penilla Group, LLP (57) ABSTRACT

An arrangement for controlling bevel etch rate during plasma processing within a processing chamber. The arrangement includes a power source and a gas distribution system. The arrangement also includes a lower electrode, which is configured at least for supporting a substrate. The arrangement further includes a top ring electrode positioned above the substrate and a bottom ring electrode positioned below the substrate. The arrangement yet also includes a first match arrangement coupled to the top ring electrode and configured at least for controlling current flowing through the top ring electrode to control amount of plasma available for etching at least a part of the substrate top edge. The arrangement yet further includes a second match arrangement configured to control the current flowing through the bottom ring electrode to control amount of plasma available for at least etching at least a part of the substrate bottom edge.

16 Claims, 5 Drawing Sheets

ARRANGEMENTS FOR MANIPULATING PLASMA CONFINEMENT WITHIN A PLASMA PROCESSING SYSTEM AND METHODS THEREOF

BACKGROUND OF THE INVENTION

Advances in technology have provided for growth in the electronic industry. In order to meet the world's growing demands for electronics, millions of semiconductor devices are needed. Semiconductor devices are usually created from dies cut from a single processed substrate.

To process a substrate, a gas mixture (e.g., etchant gas mixture) may flow into a processing chamber and be energized by radio frequency (RF) power to form an ion energy cloud (i.e., plasma). Plasma may then be employed to etch the substrate to form semiconductor devices. In many cases, it has been found that the etch rate may be higher at the edge of the substrate. It is theorized that since less substrate surface area at the substrate edge is available to be etched for a given volume of etchant, the edge of the substrate usually experiences a higher etch rate, thereby resulting in substrate non-uniformity.

As aforementioned, since more etchant is available at the edge of the substrate than at the center, the plasma formed over the substrate may be non-uniform. Since plasma uniformity is desired during substrate processing to ensure a consistent etch rate across the substrate in order to reduce the potential of creating defective semiconductor devices, most substrate processing has been focused toward the bulk area of the substrate (i.e., the area away from the edge of the substrate) where plasma uniformity has been more consistently observed. As a result, areas around the edge of a substrate have been discarded as some manufacturers considered this waste as a cost of manufacturing.

In today competitive market, processing substrates into quality semiconductor devices while minimizing waste may give a manufacturer a competitive edge. One way to reduce waste is to maximize the real estate surface of the substrate being processed and utilize as much of this real estate as possible to produce quality semiconductor devices. The ability to maximize utilization of the real estate surface of the substrate while minimizing the number of defective semiconductor devices is especially advantageous for manufacturers that utilize plasma processing systems capable of processing large substrates.

Generally speaking, by employing a processing system capable of processing large substrates, a higher number of semiconductor devices may be created per unit of machine run time in comparison to a processing system that is capable of processing substrates of smaller sizes. However, if a manufacturer is unable to process the area around the edge of a large-sized substrate to create acceptable semiconductor devices, the revenue lost experienced by the manufacturer may be high given that a large-sized substrate tends to have a larger diameter and thus a larger periphery area.

Thus, an arrangement for manipulating plasma confinement to improve substrate processing at the edge of a substrate is desired.

BRIEF SUMMARY OF THE INVENTION

The invention relates, in an embodiment, to an arrangement for controlling bevel etch rate during plasma processing within a processing chamber of a plasma processing system. The arrangement includes a power source and a gas distribution system. The arrangement also includes a lower electrode, which is configured at least for supporting a substrate during the plasma processing. The arrangement further includes a top ring electrode positioned above the substrate and a bottom ring electrode positioned below the substrate. The arrangement yet also includes a first match arrangement, which is coupled to the top ring electrode. The first match arrangement is configured at least to control current flowing through the top ring electrode to control amount of plasma available for etching at least a part of the substrate top edge. The arrangement yet further includes a second match arrangement, which is configured to control the current flowing through the bottom ring electrode to control amount of plasma available for at least etching at least a part of the substrate bottom edge.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

As aforementioned, plasma is employed to etch a substrate into semiconductor devices. Generally, an appropriate set of gases (e.g., etchant gases such as $C_4F_8$, $C_4F_6$, $CHF_3$, $CH_2F_3$, $CF_4$, $CH_3F$, $C_2F_4$, $N_2$, $O_2$, Ar, Xe, He, $H_2$, $NH_3$, $SF_6$, $BCl_3$, $Cl_2$, etc.) is flowed into a processing chamber of a plasma processing system through an inlet from a gas distribution system. These gases may interact with the RF power to ignite plasma within the processing chamber. The plasma may then be employed to etch the exposed area of the substrate.

Due to the aforementioned higher edge etch rate, plasma non-uniformity may exist. As discussed herein, uniformity refers to the etch rate consistency across a substrate surface. Without acceptable uniformity, processing the entire substrate may result in defective semiconductor devices, especially with respect to devices formed in the region around the edge of the substrate due to excessive etching.

However, in today cost-conscious world, manufacturers are searching for methods to maximize a substrate yield. In recent years, instead of discarding the area around the edge of the substrate as waste, techniques have been developed to allow a substrate to be processed using different recipes. In one example, instead of exposing the entire substrate to one recipe, areas of the substrate that have not been processed are covered to prevent the unexposed area from being etched. The unexposed area is available for future processing.

To etch the region around the edge of a substrate, techniques for performing bevel etching (etching toward the edge of a substrate) have been developed. One popular technique includes the use of dielectric ceramics. Since plasma determines the etching rate, control over the plasma results in control over the rate of etching. That is, by manipulating the plasma being formed, the desired etch rate(s) required by a processing recipe may be achieved. In an example, dielectric ceramics may be positioned above and/or below the substrate (toward the edge of the substrate) to manipulate the plasma being formed during substrate processing. In an example, different process kits (wherein each process kit may have ceramics of specific geometry and material) may be employed to generate the different etch rates that may be required by the recipe during substrate processing.

Another way to control plasma is by manipulating the RF current flow. In other words, since plasma is generated by striking the gases with RF current, plasma uniformity may be controlled by controlling the RF current flow path. Those skilled in the art are aware that the RF power may be provided to one or more of the electrodes within the processing chamber. Plasma is usually formed near the electrodes. In one aspect of the invention, the inventors herein realized that match arrangements may be employed to control the RF current path through the electrodes, thereby enabling the plasma to be manipulated to achieve the desired etch rate(s).

In accordance with embodiments of the present invention, arrangements and methods are provided to control plasma within a processing chamber. Embodiments of the invention include employing a set of match arrangements to direct the RF current path. Embodiments of the invention also include methods for manipulating the flow of the RF current during substrate processing to generate a plasma with the desired etch rate. Embodiments of the invention further include methods for manipulating the flow of the RF current to perform chamber conditioning (such as chamber cleaning).

In this document, various implementations may be discussed using a capacitively-coupled processing system, as an example. This invention, however, is not limited to capacitively-coupled processing systems and may be applied to inductively-coupled processing systems. Thus, the discussions are meant as examples and the invention is not limited by the examples presented.

In an embodiment of the invention, arrangements are provided for manipulating the plasma formed during processing by directing the RF current path. Those skilled in the art are aware that plasma tends to form in an area between two electrodes. In an example, in a capacitively-coupled processing system, plasma is usually generated between the grounded upper electrode and the lower electrode (e.g., electrostatic chuck). The plasma formed in this area is usually employed to etch the substrate that is positioned on top of the lower electrode. The plasma formed in this region has usually been employed to etch the majority of the surface of the substrate (that is the area away from the edge of the substrate).

However, during bevel etching, plasma formed between the upper and lower electrodes is not desirable since such plasma would etch the center region of the substrate instead of the bevel region. In one aspect of the invention, the inventors herein realized that by coupling a match arrangement to the upper electrode, the RF current path may be manipulated to prevent the formation of plasma in the region between the upper and lower electrodes. In other words, to prevent plasma formation, the grounded upper electrode is converted into a floating electrode. To float the upper electrode, an inductor and a capacitor within the match arrangement may be tuned to be in parallel resonance with the operating frequency of the processing chamber, in an embodiment.

Besides the upper and lower electrodes, a processing chamber capable of performing edge etching, such as a bevel processing chamber, may also include two additional electrodes. The top ring electrode (i.e., the upper extension electrode) is positioned above the substrate. The bottom ring electrode (i.e., the lower extension electrode) is positioned below the substrate. Both electrodes are positioned closed to the edge of the substrate. As a result, plasma formed near these two electrodes may be employed to etch the edge of the substrate.

In an embodiment, a set of match arrangements may be employed to control the etch rate of plasma formed near the edge of a substrate. Accordingly, the RF current path may be manipulated via the set of match arrangements to generate the desired etch rate(s) without having to replacing the ceramic process kits. In an embodiment, the set of match arrangements may include an upper match arrangement, which may be coupled to the top ring electrode to manipulate the plasma that may form near the upper edge of the substrate. Similarly, a lower match arrangement may be coupled to the bottom ring electrode to control the plasma that may form near the bottom edge of the substrate.

In an example, to minimize etching on the top edge of the substrate, the RF upper match arrangement may be set in parallel resonance with the operating frequency of the processing chamber. However, to maximize the etch rate, the RF upper match arrangement may be set in series resonance. To tune the plasma to a specific etch rate, the resonance of the RF current may be offset at the operating frequency of the processing chamber. As can be appreciated from the foregoing, the lower match arrangement can be similarly manipulated to control the etch rate for the bottom edge of the substrate. Thus, by tuning one or more match arrangements, the desired etch rate(s) may be generated.

The features and advantages of the present invention may be better understood with reference to the figures and discussions that follow.

Figure 1:
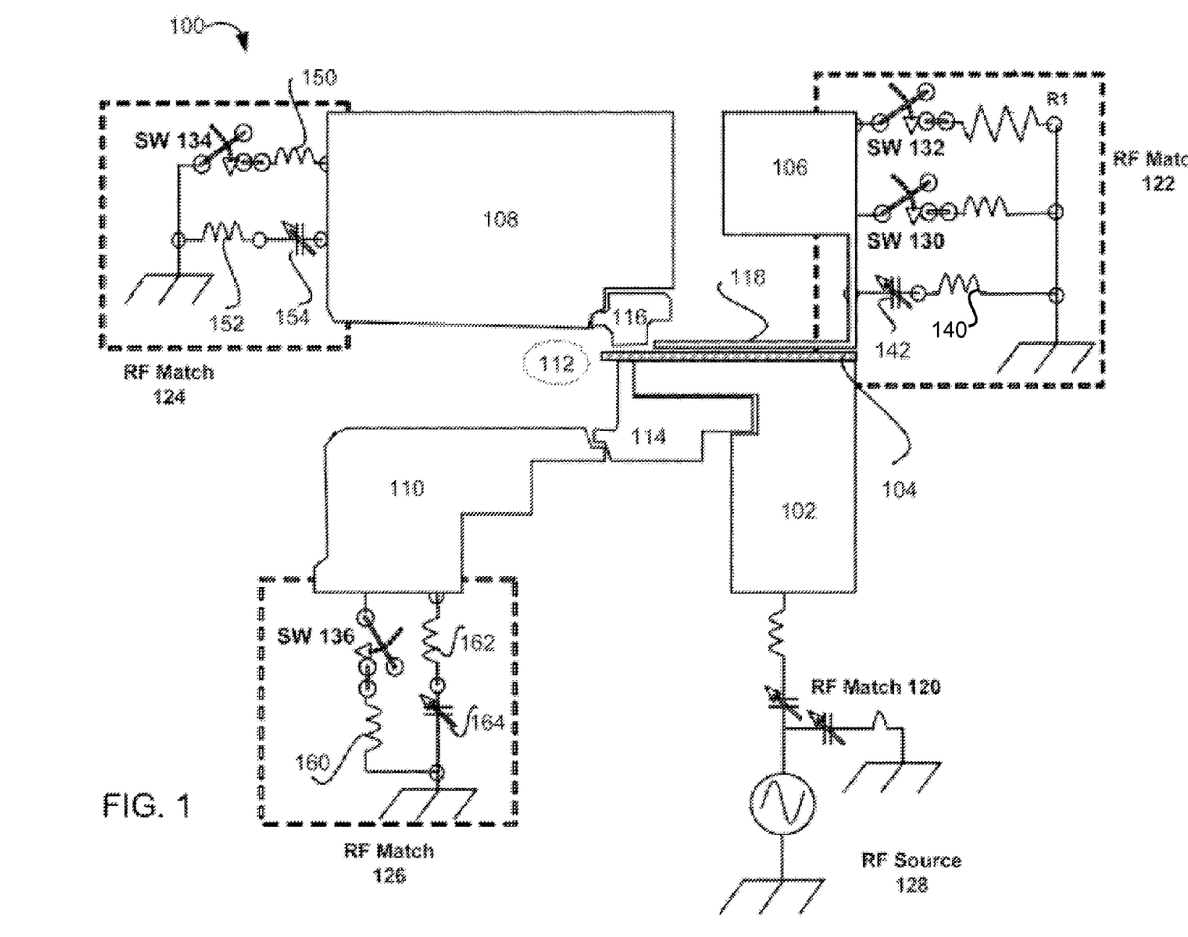
FIG. 1 shows, in an embodiment of the invention, a simple cross-sectional diagram of a bevel processing chamber with a set of match arrangements for managing plasma confinement.

FIG. 1 shows, in an embodiment of the invention, a simple cross-sectional diagram of a bevel processing chamber 100 with a set of match arrangements for managing plasma confinement. Bevel processing chamber 100 may include a lower electrode 102 (e.g., electrostatic chuck) for supporting a substrate 104 during processing. During substrate processing, power flowing from RF source 128 may flow through lower electrode 102 into bevel processing chamber 100 to interact with a gas mixture (not shown) to form a plasma. A match arrangement 120, positioned between RF source 128 and lower electrode 102 may be employed to minimize reflective power as RF current flows into bevel processing chamber 100. The plasma may be employed to process (e.g., etch) substrate 104.

Those skilled in the arts are aware that plasma may be formed in an area between upper electrode 106 and lower electrode 102. Plasma formed in this region is usually employed for processing the surface area of a substrate that is away from the edge of the substrate. However, due to the potential difference that may exist toward the edge of substrate 104, the plasma formed in this region is usually not conducive for substrate processing toward the edge of a substrate because the etch rate at the edge of the plasma is usually higher than the etch rate toward the center of the substrate. In other words, plasma tends to be less dense the further the plasma is away from the center of the substrate. As a result, nonuniform plasma may form, thereby resulting in defective semiconductor devices being created.

One way to minimize the development of plasma in the region between upper electrode 106 and lower electrode 102 is to make upper electrode 106 the RF path least likely to be traversed by the RF current. In the prior art, upper electrode 106 is usually grounded to enable plasma to be formed for substrate processing. Thus, to minimize plasma development, upper electrode 106 within processing chamber 100 is set to a float state. In an embodiment, a match arrangement 122 may be employed to control the amount of current flowing through upper electrode 106. In an example, to float upper electrode 106, switch 130 may be closed and an inductor 140 and a capacitor 142, which is in parallel, may be tuned to be in parallel resonance with the operating frequency of bevel processing chamber 100. Accordingly, without RF current flowing into the region between upper electrode 106 and lower electrode 102, plasma may be prevented from forming.

Beside upper electrode 106 and lower electrode 102, bevel processing chamber 100 may also include top ring electrode (upper extension electrode 108) and bottom ring electrode (lower extension electrode 110). Upper extension electrode is positioned above substrate 104 and lower extension electrode 110 is position below substrate 104. Both are positioned closed to the edge of substrate 104. Similar to the region near upper electrode 106, a plasma 112 may also be formed near upper extension electrode and/or lower extension electrode 110. The plasma formed here may be employed to etch the edge of a substrate.

To manipulate the plasma to generate the desired etch rate, prior arts have employed ceramic process kits, wherein each process kits may include ceramics of specific geometry and/or material. In an example, by changing the configuration of ceramics 114 and/or 116, plasma 112 may be manipulated to generate the desired etch rate required by the processing recipe. Instead of having to change the ceramics, in an embodiment, a set of match arrangements may be employed to control the amount of power being delivered into the processing chamber. In other words, by adjusting the amount of power into the processing chamber, the current flow can be adjusted, thereby manipulating the density of plasma 112 to create a uniform plasma, which in turn control the etch rate during substrate processing.

In an embodiment, a match arrangement 124 may be coupled to upper extension electrode to control the RF current flowing through upper extension electrode. Match arrangement 124 may include an inductor 150 in parallel with a variable capacitor 154 and an inductor 152. By adjusting the match arrangement, the RF current flow may be modified. In an example, by tuning inductor 150 and capacitor 154 to offset one another, the RF current flow may be controlled to create a uniformed plasma at a desired etch rate. As a result, the upper edge of substrate 104 may be processed according to the process recipe.

Similarly, a match arrangement 126 may be coupled to lower extension electrode 110 to control the RF current flowing through lower extension electrode 110, in an embodiment. Match arrangement 126 may include an inductor 160 in parallel with a variable capacitor 164 and a second inductor 162. To adjust the RF current flowing through lower extension electrode 110, match arrangement 126 may be adjusted. In an example, by offsetting the resonance of inductor 160 against variable capacitor 164, plasma confinement may be manipulated.

As can be seen from FIG. 1, match arrangements may be employed to redirect the RF current path. By controlling the flow of RF current, the formation of plasma may be directed toward specific area of the processing chamber. More over, by adjusting one or more match arrangements, specific etch rate(s) may be generated to meet a recipe guideline for processing a substrate.

FIGS. 2A, 2B, 2C, and 2D show, in embodiments of the invention, methods for managing plasma confinement within a bevel plasma chamber. FIGS. 2A, 2B, 2C, and 2D will be discussed in relation to FIG. 1.

Figure 2A:
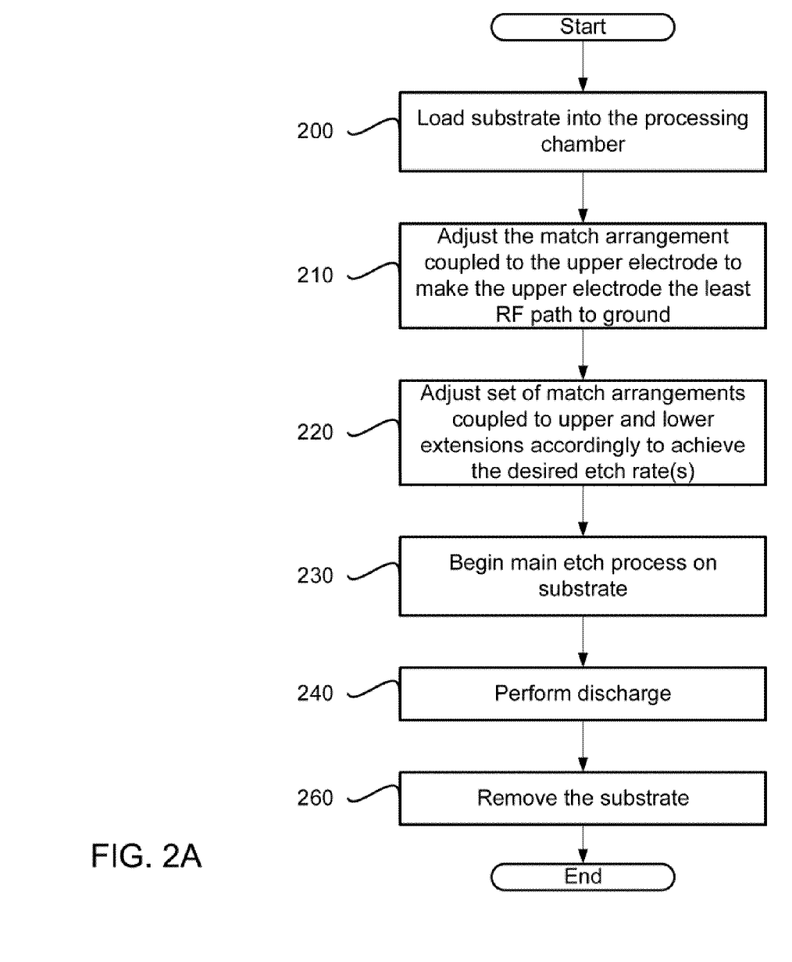
FIG. 2A, 2B, 2C, and 2D show, in embodiments of the invention, methods for managing plasma confinement within a bevel plasma chamber.

At a first step 200, a substrate is loaded into a processing chamber. Before loading the substrate, the lower electrode is prepared for accepting the substrate for processing. In an example, a lifter pin on lower electrode 102 may be raised in preparation for receiving incoming substrate 104.

Once lower electrode 102 has been prepared, the substrate is moved into the processing chamber. In an example, a robot arm may move substrate 104 into bevel processing chamber 100. Once substrate 104 is in place, the lifter pin may be lowered into processed position, thereby securing substrate 104 to lower electrode 102.

At a next step 210, a match arrangement is adjusted to make the RF current path to the upper electrode the least desirable. As aforementioned, the prior art upper electrode usually has an RF path to ground. As a result, plasma tends to form in the area between upper electrode 106 and substrate 104.

Figure 2B:
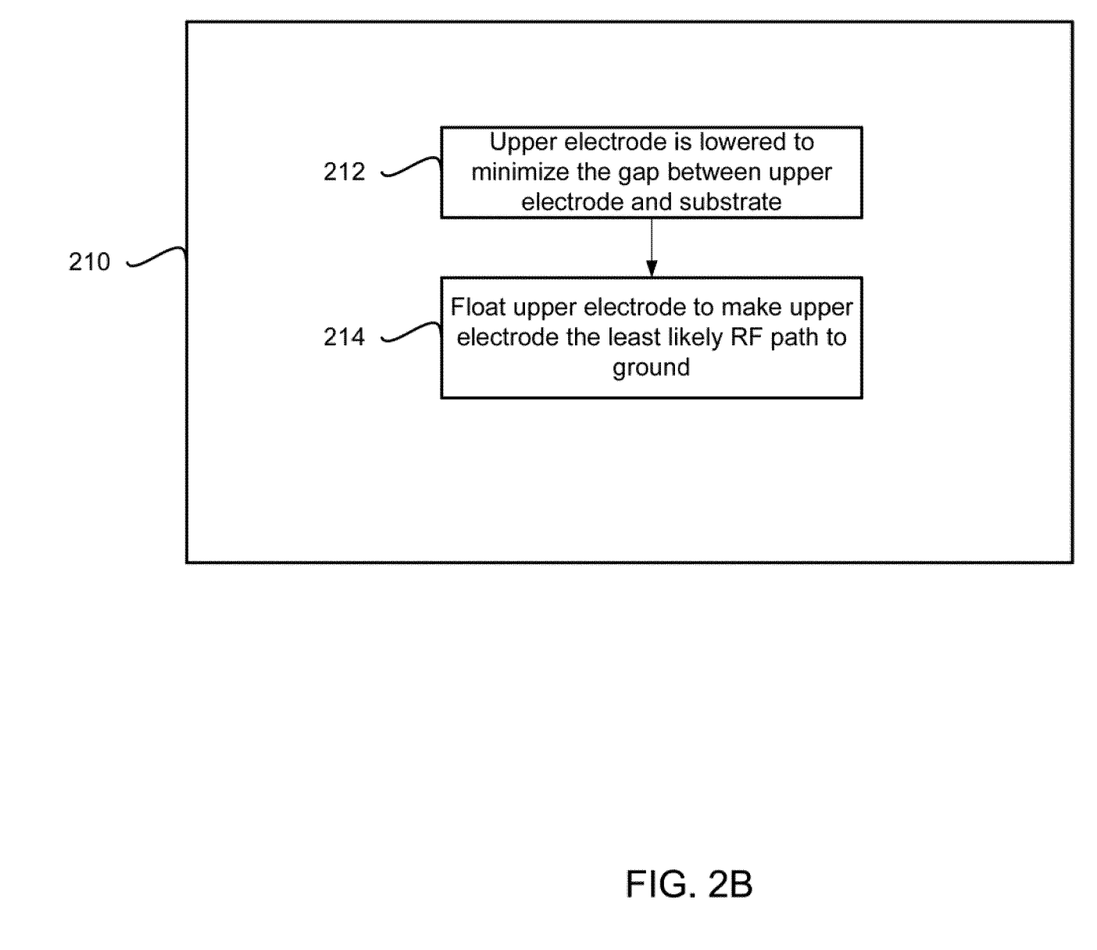

Referring to FIG. 2B, to minimize the possibility of a plasma being formed in this region, an extension 118 of upper electrode 106 may be lowered such that the gap between extension 118 and substrate 104 is minimal (but not touching), in an embodiment (Step 212). In one embodiment, the gap is about 0.35 mm, thereby minimizing the possibility of a plasma being formed in such a minute region.

Additionally or alternatively, the RF current path to ground may be eliminated by floating upper electrode 106 (Step 214). In an embodiment, floating upper electrode 106 may include adjusting match arrangement 122. In an example, switch 130 may be closed while inductor 140 and capacitor 142 may be tuned to be in parallel resonance with the operating frequency of bevel plasma chamber 100. Thus, by minimizing the gap between upper electrode 106 and substrate 104 and/or by floating upper electrode 106, a plasma may be prevented from being formed within the area between the upper electrode and the substrate.

Referring back to FIG. 2A, at a next step 220, the etch rate(s) may be manipulated by adjusting the RF current path flowing through upper extension electrode and/or lower extension electrode 110. In an embodiment, the plasma formed between upper extension electrode and lower extension electrode 110 near the edge of substrate 104 may be controlled by manipulating match arrangement 124 and/or match arrangement 126.

Figure 2C:
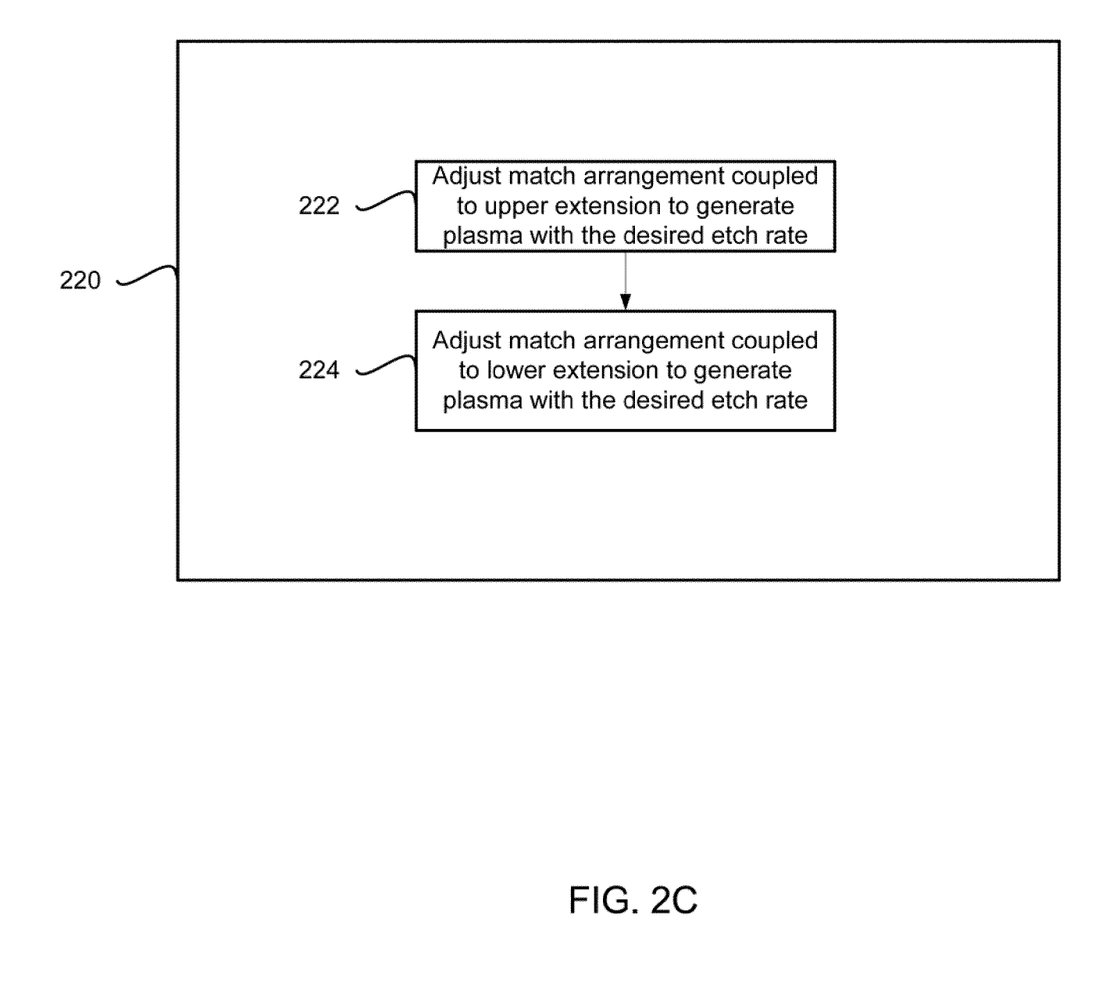

Referring to FIG. 2C, to create an RF current path to ground for upper extension electrode, switch 134 may be opened to create a short circuit (Step 222). To achieve the maximum etch rate, inductor 152 and capacitor 154 may be in series resonance at the operating frequency. However, to control the etch rate, tuning may occur by offsetting inductor 152 against capacitor 154 such that inductor 152 and capacitor 154 are in resonance with the operating frequency of the processing chamber. In other words, to create a uniform plasma at a given etch rate, the inductor and/or capacitor within match arrangement 124 may have to be tuned. By adjusting match arrangement 124, etching on the top edge of substrate 112 may be controlled.

Similarly, etching on the bottom edge of substrate 112 may be controlled by adjusting match arrangement 126 (Step 224). Similar to switch 134, switch 136 is opened to create an RF current path to ground for lower extension electrode 110. To get a maximum etch rate, inductor 162 and capacitor 164 are in series resonance at the operating frequency of bevel processing chamber 100. To control plasma 112 to generate the desired etch rate as required by a processing recipe, the RF match arrangement may be employed to tune the resonance by offsetting inductor 162 against capacitor 164.

Referring back to FIG. 2A, once the desired etch rate has been set, at a next step 230, etching may begin on the substrate.

At a next step 240, discharge is performed after substrate processing has been terminated.

Figure 2D:
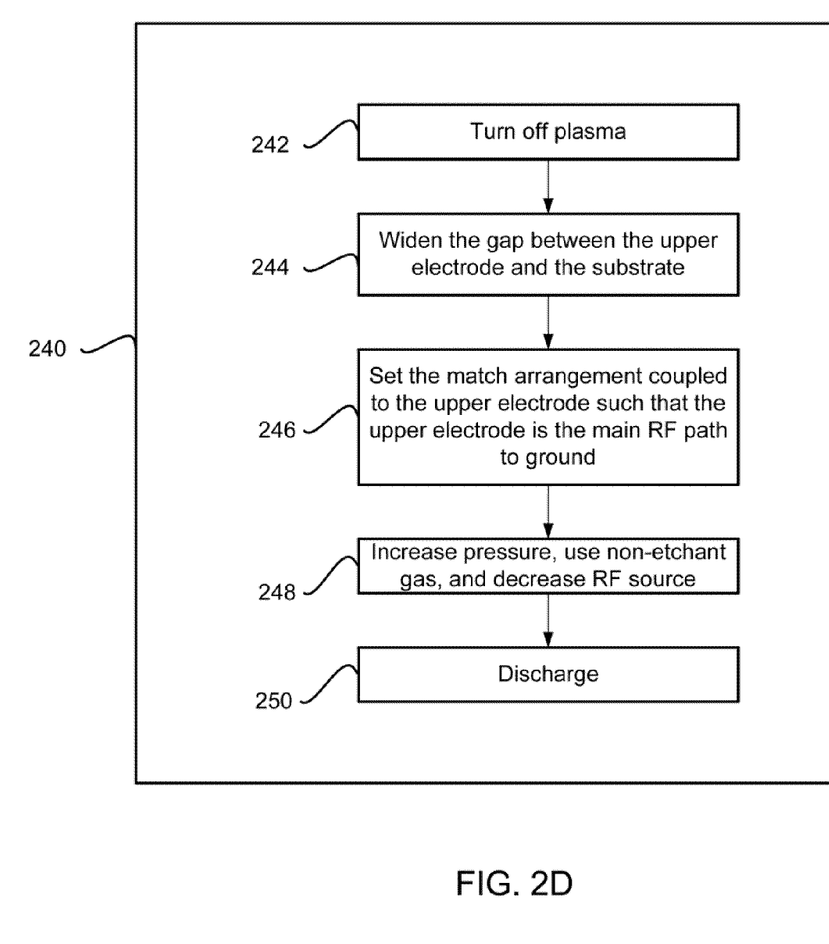

Referring to FIG. 2D, once etching has been completed, plasma is turned off (Step 242).

Once plasma has been turned off, preparation is made to remove substrate 112 from bevel processing chamber 100.

First, the upper electrode is moved away from the substrate to create a gap large enough to form a plasma (Step 244). In an embodiment, the gap between extension 118 of upper electrode 106 and substrate 104 is widened. In one embodiment, the gap is about 19 mm.

Next (Step 246), RF match arrangement 122 is manipulated to create an RF current path to ground for upper electrode 106. In an example, switch 130 is turned off while switch 132 is turned on. In an embodiment, the amount of discharge is controlled by the variable resistor (R1).

At step 248, the pressure is increased to reduce ion bombardment, which in turn minimizes the possibility of the plasma being generated to perform etching. In an embodiment, the amount of pressure may be about 40 percent more than the amount during the substrate processing. In an embodiment, the gas being employed to form plasma is a non-etching gas. In another embodiment, RF source 128 is decreased such that the amount of power being pumped into the processing chamber is sufficient to create a minimal-powered plasma capable of performing the discharge, but one incapable of etching the substrate. In one embodiment, RF source 128 is set at about 50 watt.

At step 250, discharge occurs on the substrate and/or the lower electrode. In an embodiment, the discharge period is about 5 seconds.

Referring back to FIG. 2A, after the discharge has occurred, the substrate is removed (Step 260). Before removing the substrate, the plasma is turned off. Then, the pressure is pumped out of the processing chamber. Finally, the lifter pin is raised and the substrate is removed from the processing chamber.

Advantageously, the aforementioned match arrangement may also be applied in performing a waterless auto clean. Those skilled in the art are aware that to ensure consistent plasma processing result, the processing chamber may be cleaned while a substrate is absent from the chamber. In an example, chamber conditioning may be performed between the processing of each substrate, for example. In other words, by performing chamber conditioning, the process chamber is cleaned and reset to a known state before another substrate is processed. Thus, the process of performing chamber conditioning allows for byproducts, such as polymer deposits, that may have been deposited on the surface (e.g., wall surface) of the processing chamber to be removed.

In an embodiment, match arrangement 122 may be employed to perform a waterless cleaning processing within the bevel process chamber. In an embodiment, both switch 130 and switch 132 is turned on, thereby creating an RF path to ground for upper electrode 106. As a result, plasma is formed between upper electrode 106 and lower electrode 102. The plasma formed may be employed to remove the byproducts still remaining within the processing chamber. Thus, waterless chamber cleaning may be performed quickly by adjusting match arrangement 122.

As can be appreciated from the forgoing, one or more embodiments of the present invention provide for arrangements and methods for performing plasma confinement within a bevel processing chamber. By adjusting one or more match arrangements, the RF path may be directed in such a way that plasma is formed near the edge of the substrate. By tuning one or more inductor/capacitor, the desired etch rate required by a recipe may be generated. Accordingly no additional component is required to control plasma uniformity, thereby reducing the cost of ownership. Consequently, the arrangements and methods as discussed herein provide another inexpensive method for increasing substrate yield.

While this invention has been described in terms of several preferred embodiments, there are alterations, permutations, and equivalents, which fall within the scope of this invention. Although various examples are provided herein, it is intended that these examples be illustrative and not limiting with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. An arrangement for controlling bevel etch rate during plasma processing within a processing chamber of a plasma processing system, comprising:
   a power source;
   a gas distribution system;
   a lower electrode, wherein said lower electrode is configured at least for supporting a substrate during said plasma processing;
   a top ring electrode positioned to cover a top edge of said substrate;

a bottom ring electrode positioned to cover a bottom edge of said substrate;

a first match arrangement disposed between said top ring electrode and ground, said first match arrangement is configured at least to control current flowing through said top ring electrode to control amount of plasma available for etching at least a part of a top edge of said substrate, wherein the first match arrangement includes a first parallel circuit comprising a series circuit of a variable capacitor and a first inductor connected in parallel to a series circuit of a second inductor and a switch;

a second match arrangement disposed between said bottom ring electrode and ground and is configured to control said current flowing through said bottom ring electrode to control amount of plasma available for etching at least a part of a bottom edge of said substrate, wherein the second match arrangement includes a second parallel circuit comprising a series circuit of a variable capacitor and a first inductor connected in parallel to a series circuit of a second inductor and a switch; and an upper electrode positioned directly above said substrate, the upper electrode having a surface that substantially covers a top surface of the substrate except for the top edge of the substrate, the upper electrode having an extension that extends the surface of the upper electrode up to the top edge of the substrate, the upper electrode and the extension of the upper electrode being disposed over the top surface of the substrate such that a gap that is less than about .35 mm is maintained to prevent formation of plasma in an area between the upper electrode and the top surface of the substrate;

a first ceramic element is disposed between the extension and the top ring electrode;

a second ceramic element is disposed between the lower electrode and the bottom ring electrode; and a third match arrangement, wherein said third match arrangement is coupled to said upper electrode, wherein said third match arrangement is configured to control said current flowing through said upper electrode to change said upper electrode from a grounded state to a floating state, thereby minimizing plasma formation between said upper electrode and said lower electrode;

wherein said third match arrangement includes at least a switch, an inductor, and a variable capacitor, the inductor is in series with the variable capacitor of the third match arrangement, wherein said switch of the third match arrangement is set to a closed position, wherein said inductor and said capacitor of the third match arrangement is tuned to be in parallel resonance with an operating frequency of said processing chamber to set said upper electrode at said floating state.

2. The arrangement of claim 1 wherein for said first match arrangement, said switch is set to an open position, wherein said first inductor and said variable capacitor are in series resonance with an operating frequency of said processing chamber to control etching on said substrate top edge.

3. The arrangement of claim 1 wherein for said second match arrangement, said switch is set to an open position, wherein said first inductor and said variable capacitor are in series resonance with an operating frequency of said processing chamber to control etching on said substrate bottom edge.

4. The arrangement of claim 1 wherein said plasma processing system is a capacitively-coupled processing system.

5. The arrangement of claim 1 wherein said power source is a radio frequency power source that is coupled to said lower electrode by way of an RF match.

6. The arrangement of claim 1, wherein the first ceramic element surrounds the extension of the upper electrode.

7. The arrangement of claim 1, wherein the second ceramic element surrounds the lower electrode.

8. A plasma processing system, comprising:

a power source;

a gas distribution system;

a lower electrode, wherein said lower electrode is configured at least for supporting a substrate during said plasma processing;

an upper electrode having an extension that extends a surface of the upper electrode up to a top edge of the substrate, said upper electrode and the extension disposed over the top surface of the substrate define a minimized gap between said upper electrode and said lower electrode, a size of the gap defined to prevent formation of a plasma in an area between the upper electrode and the lower electrode;

a top ring electrode positioned to cover the top edge of said substrate and surrounding the upper electrode;

a bottom ring electrode positioned to cover a bottom edge of said substrate and surrounding said lower electrode, wherein the top ring electrode is arranged opposite the bottom ring electrode to define a region there-between for forming plasma around a bevel edge of the substrate when the substrate is disposed over the lower electrode;

a first match arrangement including a first parallel circuit electrically connected between the top ring electrode and ground, the first parallel circuit includes a series circuit of a variable capacitor and a first inductor connected in parallel to a series circuit of a second inductor and a switch;

a second match arrangement including a second parallel circuit electrically connected between the bottom ring electrode and ground, the second parallel circuit includes a series circuit of a variable capacitor and a first inductor connected in parallel to a series circuit of a second inductor and a switch; and a third match arrangement being electrically coupled to said upper electrode, a switch from the third match arrangement and the switch from the first and the second match arrangements used to selectively control plasma formation in specific areas within a processing chamber of the plasma processing system.

9. The plasma processing system of claim 8, wherein the third match arrangement includes a third parallel circuit electrically connected between the upper electrode and ground, the third parallel circuit includes, a first circuit portion including a variable capacitor in series with an inductor;

a second circuit portion including a first switch in series with an inductor;

a third circuit portion including a second switch in series with a resistor;

wherein the first, second and third circuit portions are in parallel with each other between the upper electrode and ground and wherein the variable capacitor and the inductor of the first circuit portion are in parallel resonance with an operating frequency of said processing chamber and the first switch is set in a closed position to allow the upper electrode to be set at floating state.

10. The arrangement of claim 8, wherein for said first match arrangement,
said switch is set to an open position,
wherein said first inductor and said variable capacitor are in series resonance with an operating frequency of said processing chamber to control etching on said substrate top edge.

11. The arrangement of claim 8, wherein for said second match arrangement,
said switch is set to an open position,
wherein said first inductor and said variable capacitor are in series resonance with an operating frequency of said processing chamber to control etching on said substrate bottom edge.

12. The plasma processing system of claim 8, further includes,
a first ceramic element is disposed between the extension and the top ring electrode; and
a second ceramic element is disposed between the lower electrode and the bottom ring electrode.

13. The plasma processing system of claim 12, wherein the first ceramic element surrounds the extension of the upper electrode and the second ceramic element surrounds the lower electrode.

14. A plasma processing system, comprising:
an RF power source;
a gas distribution system;
a lower electrode, wherein said lower electrode is configured at least for supporting a substrate during said plasma processing;
an upper electrode disposed over the lower electrode, the upper electrode including an extension that extends a surface of the upper electrode up to a top edge of the substrate, wherein when the upper electrode is moved, the upper electrode and the extension are disposed to define a minimal gap between the surface of the upper electrode and a top surface of the substrate so as to prevent formation of a plasma in an area defined between said surface of the upper electrode and the top surface of said substrate;
a top ring electrode positioned to cover the top edge of said substrate and surrounding the upper electrode;
a bottom ring electrode positioned to cover a bottom edge of said substrate and surrounding said lower electrode, wherein the top ring electrode is arranged opposite the bottom ring electrode to define a region there-between for forming plasma around a bevel edge of the substrate when the substrate is disposed over the lower electrode;
a first match arrangement including a first parallel circuit electrically connected between the top ring electrode and ground, the first parallel circuit includes a series circuit of a variable capacitor and a first inductor in parallel to a series circuit of a second inductor and a switch;
a second match arrangement including a second parallel circuit electrically connected between the bottom ring electrode and ground, the second parallel circuit includes a series circuit of a variable capacitor and a first inductor in parallel to a series circuit of a second inductor and a switch; and
a third match arrangement being electrically coupled to said upper electrode, wherein the third match arrangement includes a third parallel circuit electrically connected between the upper electrode and ground, wherein third parallel circuit includes,
a first circuit portion including a variable capacitor in series with an inductor;
a second circuit portion including a first switch in series with an inductor;
a third circuit portion including a second switch in series with a resistor;
wherein the first, second and third circuit portions are in parallel with each other between the upper electrode and ground and wherein the switch from the first, the second and the third match arrangement used to selectively control plasma formation in specific areas within a processing chamber of the plasma processing system.

15. The plasma processing system of claim 14, further comprising,
an upper ceramic ring disposed around the upper electrode and adjacent to the upper ring electrode; and
a lower ceramic ring disposed round the lower electrode and adjacent to the bottom ring electrode.

16. The plasma processing system of claim 14, wherein the first, second and third match arrangements are coupled to ground and not to the RF power source, the RF power source only being coupled to the lower electrode via an RF match to define a capacitively-coupled processing system.

* * * * *